(12) United States Patent
Ellison et al.

(10) Patent No.: US 9,857,440 B2
(45) Date of Patent: Jan. 2, 2018

(54) METAL DETECTOR ASSEMBLY AND METHOD OF ASSEMBLING A METAL DETECTOR

(71) Applicant: Mettler-Toledo Safeline Ltd., Salford, Manchester (GB)

(72) Inventors: Paul Ellison, Saddleworth (GB); Tim Mills, Heywood (GB); Daren Butterworth, Manchester (GB)

(73) Assignee: METTLER-TOLEDO SAFELINE LTD., Manchester (GB)

( * ) Notice: Subject to any disclaimer, the term of this patent is extended or adjusted under 35 U.S.C. 154(b) by 12 days.

(21) Appl. No.: 15/185,412

(22) Filed: Jun. 17, 2016

(65) Prior Publication Data

US 2016/0291098 A1    Oct. 6, 2016

Related U.S. Application Data

(63) Continuation of application No. PCT/EP2014/078854, filed on Dec. 19, 2014.

(30) Foreign Application Priority Data

Dec. 20, 2013    (EP) .................................... 13198762

(51) Int. Cl.
    *G01R 33/02*    (2006.01)
    *G01R 33/12*    (2006.01)
    (Continued)

(52) U.S. Cl.
    CPC ......... *G01R 33/12* (2013.01); *G01R 33/0052* (2013.01); *G01V 3/105* (2013.01)

(58) Field of Classification Search
    CPC ..... G01R 33/12; G01R 33/0052; G01V 3/105
    (Continued)

(56) References Cited

U.S. PATENT DOCUMENTS

| 6,025,562 A |   | 2/2000 | Shimizu et al. |   |
|---|---|---|---|---|
| 2004/0155651 A1 | * | 8/2004 | Britton | ................... G01V 3/107 324/243 |
| 2009/0021252 A1 | * | 1/2009 | Simon | ................... G01V 3/104 324/236 |

FOREIGN PATENT DOCUMENTS

| GB | 2 232 254 A | 12/1990 |
|---|---|---|
| GB | 2 267 351 A | 12/1993 |

(Continued)

OTHER PUBLICATIONS

International Search Report (PCT/ISA/210) dated Apr. 2, 2015, by the European Patent Office as the International Searching Authority for International Application No. PCT/EP2014/078854.

(Continued)

*Primary Examiner* — Reena Aurora
(74) *Attorney, Agent, or Firm* — Buchanan Ingersoll & Rooney PC

(57) ABSTRACT

A stable assembly of a metal detector is disclosed which can ensure a tension free physical connection between a former and a case of the metal detector. The metal detector includes a case with at least four closed sides and two openings, a non-conductive former having a pass-through aperture, and electromagnetic coils arranged on the former to produce an electromagnetic field within the former which is disturbed by a metallic body passing through the aperture. The former formed into a single piece and having a width equal to the inner width of the case, is inserted into the case from the front side of the case. The space between the former and the case is filled with a potting medium. The physical connection between the former and the case includes a protruding-recess which is strengthened by an adhesive.

20 Claims, 10 Drawing Sheets

(51) Int. Cl.
*G01V 3/10* (2006.01)
*G01R 33/00* (2006.01)

(58) Field of Classification Search
USPC .......................................................... 324/258
See application file for complete search history.

(56) References Cited

FOREIGN PATENT DOCUMENTS

| | | |
|---|---|---|
| JP | 7-287070 A | 10/1995 |
| JP | 8-75866 A | 3/1996 |
| WO | WO 95/11462 A1 | 4/1995 |

OTHER PUBLICATIONS

European Search Report (EPO Form 1507N) dated Jun. 4, 2014, 13198762.0-1559.
International Preliminary Report on Patentability (Form PCT/IB/373) and the Written Opinion of the International Searching Authority (Forms PCT/ISA/237) dated Jun. 21, 2016, by the International Bureau of WIPO in corresponding International Application No. PCT/EP2014/078854. (6 pgs).

* cited by examiner

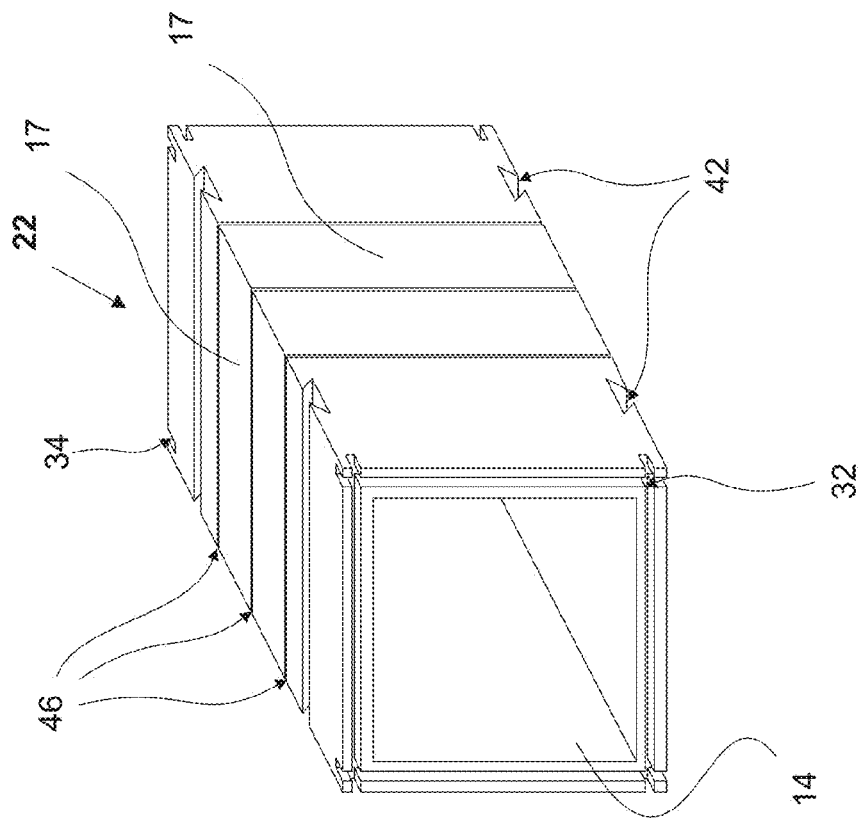
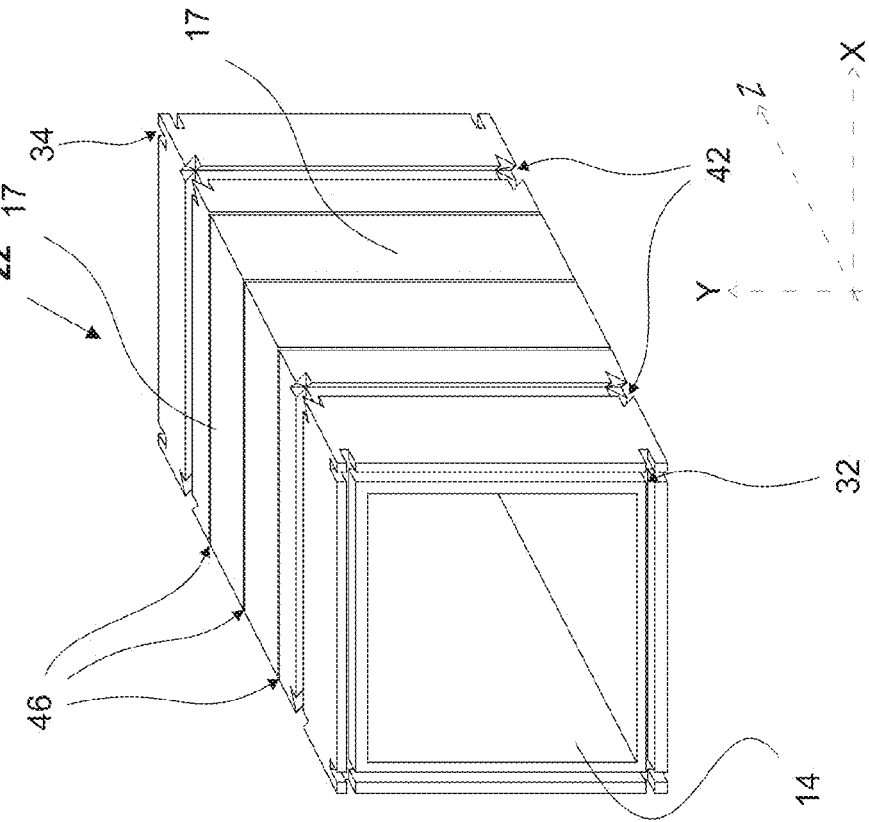

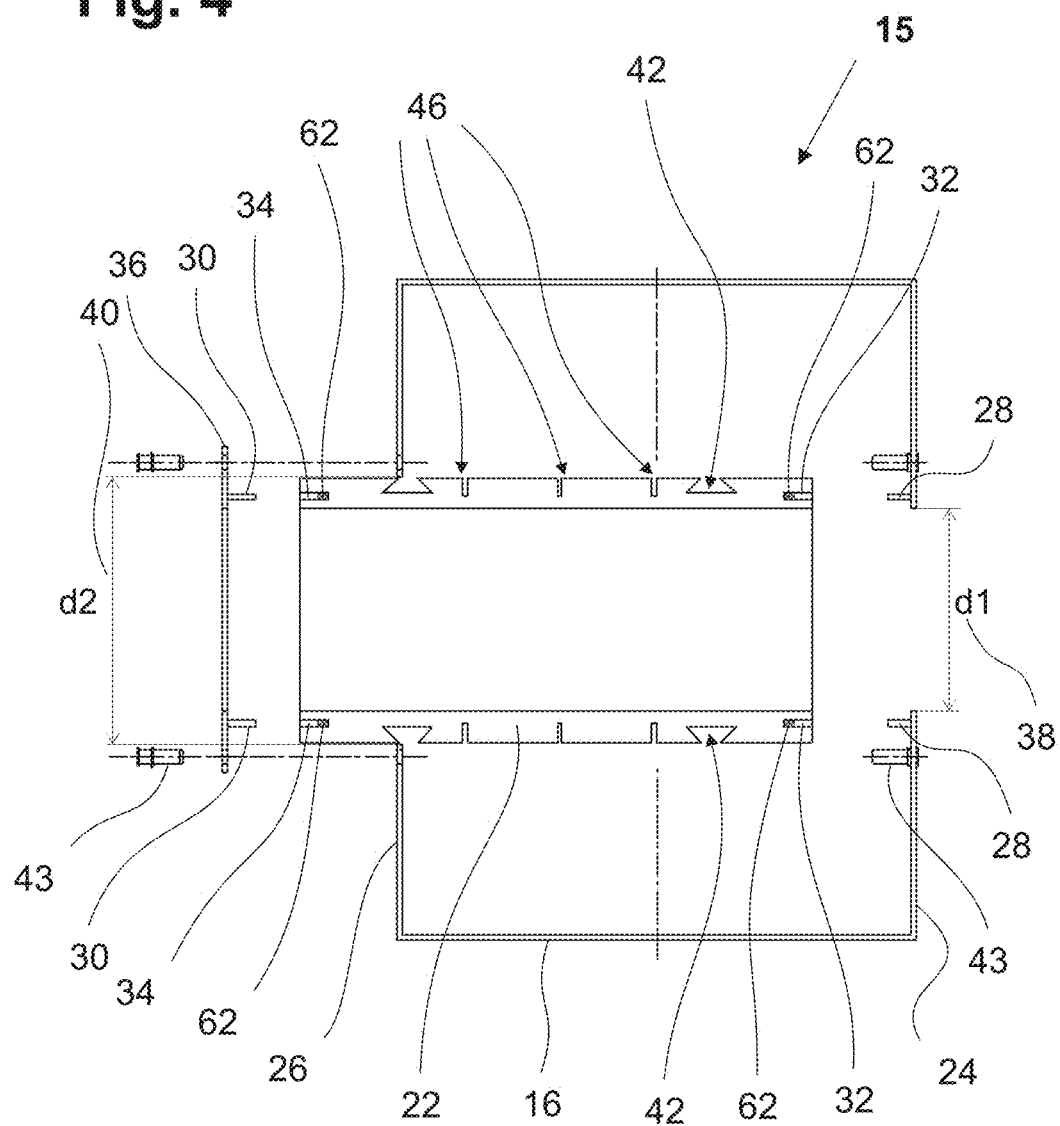

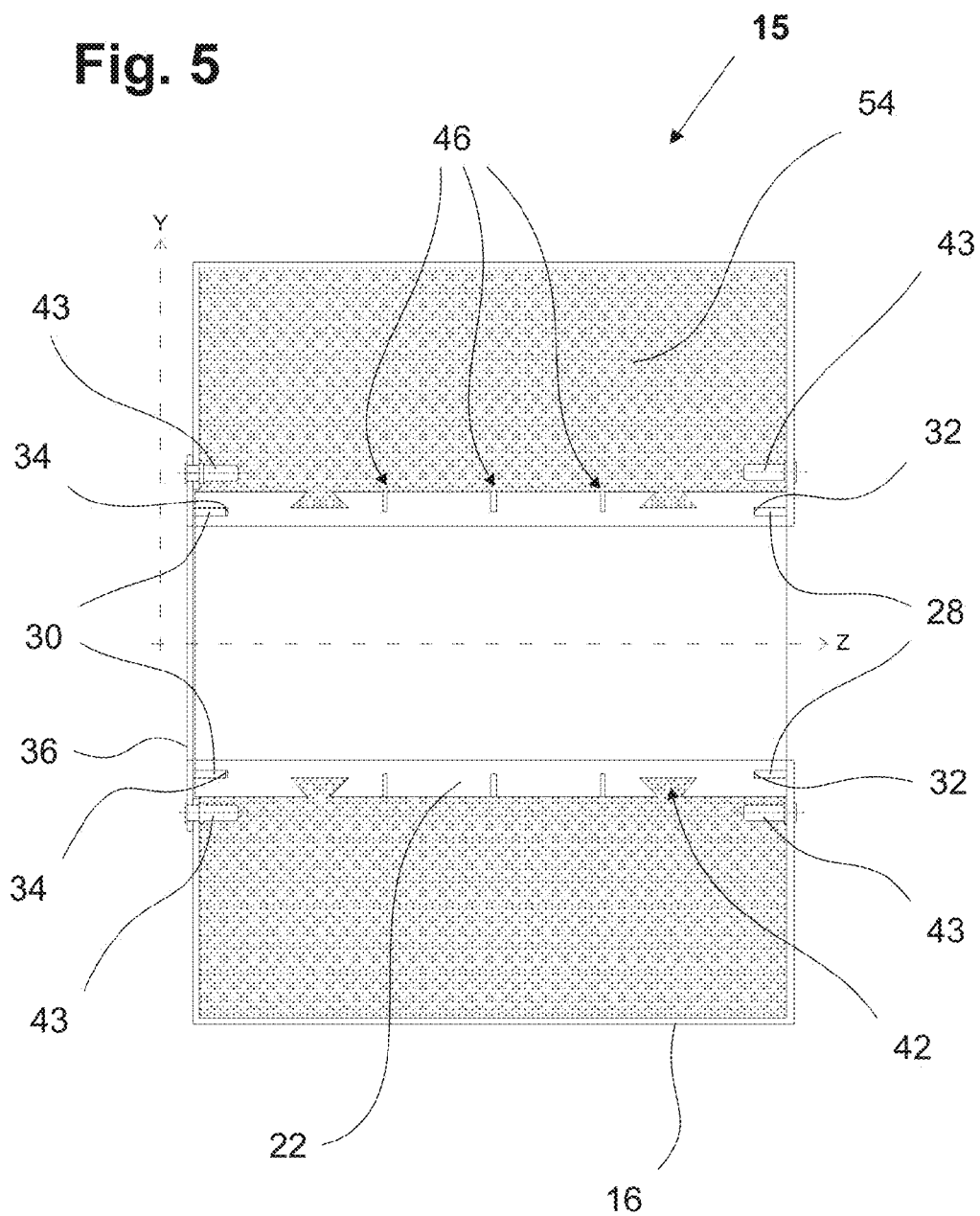

METAL DETECTOR ASSEMBLY AND METHOD OF ASSEMBLING A METAL DETECTOR

RELATED APPLICATIONS

This application claims priority as a continuation application under 35 U.S.C. §120 to PCT/EP2014/078854, which was filed as an International Application on Dec. 19, 2014 designating the U.S., and which claims priority to European Application 13198762.0 filed in Europe on Dec. 20, 2013. The entire contents of these applications are hereby incorporated by reference in their entireties.

FIELD

The present invention is related to a metal detector and a method to assemble a metal detector.

BACKGROUND

In the industry where machinery is involved in the production of goods, there is always a probability that a piece of metal, such as a screw or a bolt, does break away from the machinery, and finally ends up in the processed product. Therefore metal detection systems are used at various stages of a production process to detect products that are contaminated by metal. Metal detection systems are also often used for inspecting finished product, in order to ensure consumers' safety and quality standards.

A known metal detector used for detecting metallic presence in products generally can include an electromagnetic coil arrangement on a former or also called a frame assembly having an pass-through aperture. The former assembly is surrounded by a housing or case and the remaining space between the former assembly and the case is filled with a potting medium.

A metal detection system as mentioned above includes a former assembly with an electromagnetic coil arrangement that can include three coils, one transmitter coil and two receiver coils that are aligned in parallel. Since the two receiver coils are identical and at the same distance from the transmitter coil, an identical voltage is induced in each of the receiver coils. When the receiver coils are connected in opposition, these voltages cancel out resulting in a zero output when there is no product present in the metal detector. This is a balanced coil system. During the inspection process, the product, for example transported on a conveyor belt, is passed through the coils of the balanced coil system. In the transmitter coil which can be placed between the receiver coils, flows an electrical current that generates an alternating magnetic field that induces an electrical signal in the two receiver coils. In most metal detectors like mentioned above, the receiver coils are positioned symmetrically to the transmitter coil, so that identical signals are induced in both receiver coils when no product is present in the balanced coil system. In addition, the receiver coils are coupled together in such a manner that the signals induced therein are subtracted from each other. In that way, when no product is present in the balanced coil system, there is a zero signal at the output of the receiver coils. However, a piece of magnetically and/or electrically conductive material that passes through the balanced coil system will disturb the magnetic field and will cause modifications of the electrical signal that is induced in the receiver coils. These perturbations occur first in the first receiver coil and then in the second receiver coil, when the product approaches it.

Metal detector assemblies are known which include a coil-carrying former or a plurality of laminated frames that form the former between which the transmitting and receiving coils are located surrounded by a case or housing. Such assemblies can be complicated and costly to manufacture; additionally and/or alternatively they can be subject to tension due to the instability between the case, former and the coils. Such instability in the assembly can lead to issues such as electronic drift and reduction in repeatability which in turn affects the yield of the detector.

To ensure a stable design and construction of a metal detector, it is of high importance that the physical connections made between the various components of a metal detector have to be stable avoiding vibrations and cause minimum if not eliminate the tension between them.

The document WO 95/11462 A1 discloses a method of joining the case and the former of a metal detector. The method includes using mechanical fixings like aluminum dowels. These aluminum dowels, however, themselves not being a part of the case or former (it is an external entity) introduce a mechanical tension between the case and the former in case of vibrations or shocks. In an another embodiment, the document discloses a tongue-groove joint to join the parts of the case to each other and also the case to the former in certain adjoining parts. As mentioned in the document, the tongue-groove joint is intended to provide a minimum magnetic leakage from the joint faces of the case. The document however, does not disclose measures taken to ensure the tension free physical connection or physical joint between the former and the case which in turn affects the stability of the metal detector.

The document GB 2267351 A discloses a method for assemblying a metal detector. In the document, the former is constructed from three frames and held together with the use of a glue or an interlock, after which the coils are arranged on the former. A layer of plastic coating which acts like a potting medium is formed on the former followed by an application of a metal layer coating using methods like metallic painting, arcspraying, plating, or vacuum depositing. This metal layer coating upon hardening forms the case or the housing of the metal detector. The disclosed method in terms of case construction uses methods like metallic painting, arcspraying, that can be expensive in terms of resources and labour.

It is known in the art that the stability between a former and a case can be further ensured by introducing a potting or a plastic medium in the empty space between the two. The potting medium used can be resin or foam or in some cases concrete, which holds the assembly together. Examples of using a potting medium for the above purpose are discussed in documents GB 2267351 A, GB 2232254 A and WO 95/11462 A1. However, the contact surface between the former and the potting medium is limited to a flat horizontal plane which leads to a weak connection between the two. In presence of mechanical vibrations or shocks, the potting medium may move with respect to the former due to the weak contact surface area between them.

In addition, known formers can have smaller widths than that of the case. In case of such formers with a small width, they can be covered with a potting medium and then encompassed by a case, increasing the chances of instability.

Metal detectors can have pass-through apertures lined with a conductive material like an electrostatic screen to protect the coils from a phenomenon called bulk effect, the more scientific term of which is capacitive effect. It is known that at low operating frequencies, the electrostatic screen is applied across each side of the pass-through aperture leaving a small gap to the edge of the case to ensure no contact with the case in order to avoid intermittent eddy currents to flow through the screen picked up by the metal detector receiver coils creating unwanted nuisance detection signals. Further, at higher operating frequencies, it becomes necessary to remove the gaps and hence the electrostatic screen is fitted directly across onto the case. However, although this is effective as a screen, it presents a risk to the stability of the metal detector. Any cracks appearing at the screen transition onto the case has the potential to cause the abovementioned issues.

SUMMARY

A metal detector is disclosed comprising: a case having at least four closed sides, a front side and a rear side; a first opening on the said rear side of said case and a second opening on the front side of said case; a former having a pass-through aperture, coaxial with said first and said second openings of said case, said case having an inner width (W2) in a direction along the pass-through aperture, said former having a width (W1) in a direction along the pass-through aperture, wherein said width (W1) of said former is equal to said inner width (W2) of said case; an arrangement of electromagnetic coils for generating and receiving an electromagnetic field inside of said pass-through aperture, wherein said coils are arranged on said former; said case surrounding said former; first protruding means attached to said case adjacent to said first opening of said case, first and second recessing means formed in said former, adhesive means which bonds said first protruding means to said first recessing means; a potting medium filling a space between said former and said case; and keying slots on at least one surface directed towards any said closed side of said case; wherein said keying slots are filled with the potting medium and increase a contact area between said former and said potting medium.

A method is also disclosed for assembling a metal detector having a case with front and rear sides; a first opening on the said rear side of said case and a second opening on the front side of said case; a former having a pass-through aperture, coaxial with said first and said second opening of said case, said case having an inner width (W2) in a direction along the pass-through aperture; said former further having a width (W1) in a direction along the pass-through aperture, and wherein the width (W1) of said former is equal to the inner width (W2) of said case; first protruding means arranged on the inside of said case adjacent to said first opening of said case; first and second recessing means formed in said former; and keying slots in said former on at least one surface directed towards said case; the method comprising: providing an arrangement of electromagnetic coils for generating and receiving an electromagnetic field inside of said pass-through aperture and arranging said electromagnetic coils on said former; providing adhesive means to bond said first protruding means to said first recessing means and applying said adhesive means to said first recessing means of the said former; inserting said former into said case by sliding said first recessing means of said former towards said first protruding means in said rear side of said case; providing a retainer including second protruding means; applying adhesive means to said second recessing means of the said former; inserting said second protruding means of said retainer into said second recessing means of said former; fixating said retainer on said case from the front side of said case; and filling a potting medium in the space between said former and said case.

BRIEF DESCRIPTION OF THE DRAWINGS

Reference is made to the accompanying schematic drawings from which its novel features and advantages will be apparent.

In the drawings:

FIGS. 3A, 3B show two different exemplary embodiments of the former with recessing means and keying slots according to an exemplary embodiment in a 3-D perspective;

FIG. 4 is a side view of the case-former assembly cut along the Y-Z plane shown in FIG. 2, wherein the former is inserted into the case from the front side of the case;

FIG. 5 is a side view of the case-former assembly cut along the Y-Z plane shown in FIG. 2, after the insertion of the former in the case from the front side of the case and the filling of the empty space with a potting material;

DETAILED DESCRIPTION

Figure 1:
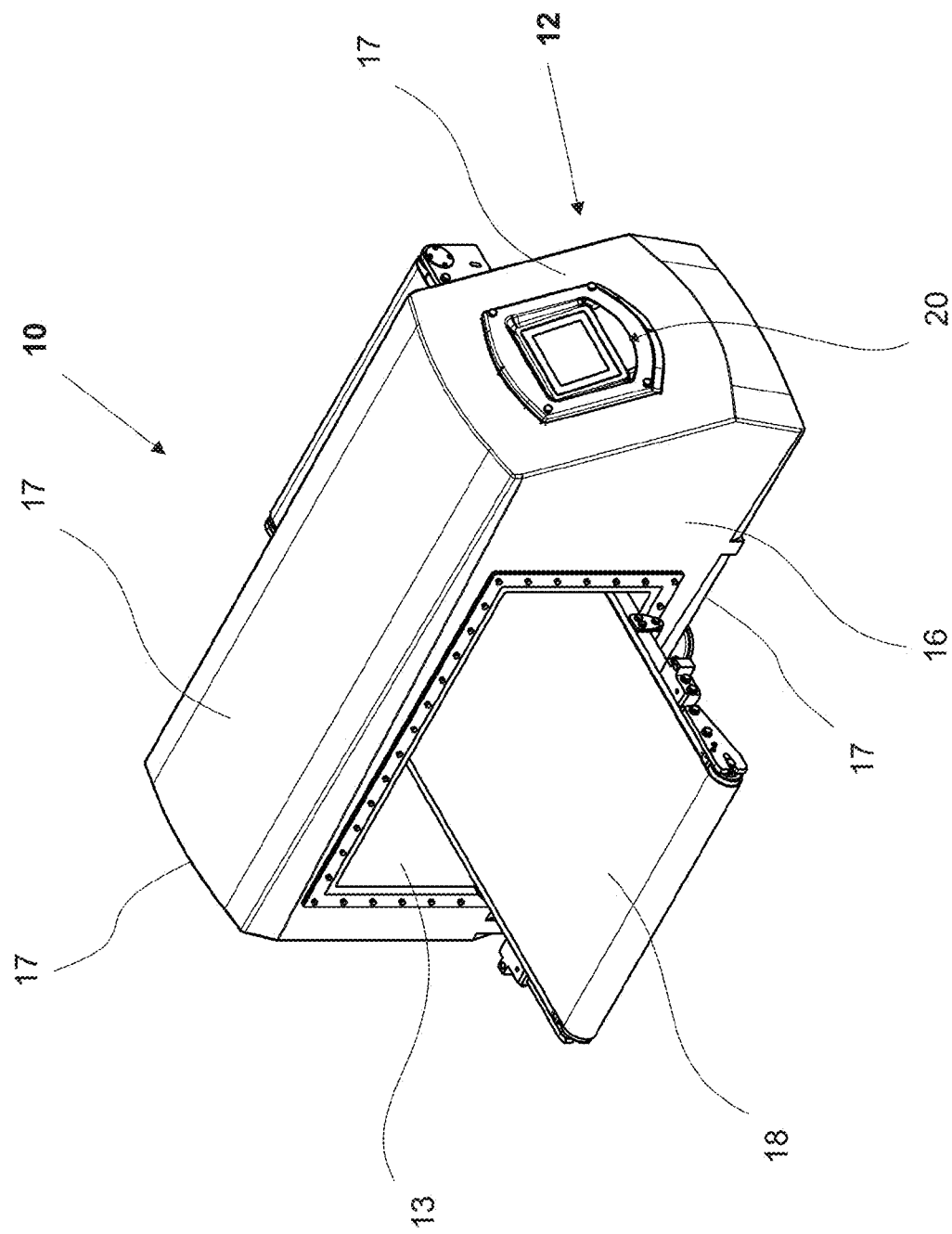
FIG. 1 is an isometric view of a known metal detector.

A stable assembly of a metal detector can be achieved in accordance with exemplary embodiments by ensuring a tension free physical connection between the former and the case.

A stable and tension free assembly of a metal detector as disclosed can ensure increased stability between the former and the potting medium which in turn stabilizes the former with respect to the case.

Exemplary embodiments provide an easy and cost-saving method for assembling a metal detector.

According to the present disclosure in one aspect, there is provided a metal detector having a case having at least four closed sides and two openings, a first opening on the rear side of the case and a second opening on the front side of the case. The metal detector includes a non-conductive former that is inserted within the case and means for securing the former to the front and rear sides of the case. The former has a pass-through aperture coaxial with the first and the second opening of the case, wherein the width of the former is the distance from the front side to the rear side of the case and is equal to the inner width of the case in a direction along the pass-through aperture. About the circumference of the former are provided balanced transmitting and receiving coils which operate to produce and detect within the former an electromagnetic field which is disturbed by a metallic body passing through the aperture.

The case and former are physically connected wherein protruding means, on the case are inserted into recesses of the former which are further toughened with the help of an adhesive. This physical connection offers minimum if no tension between the case and the former as they are not fixed using mechanical fixing like screws. An exemplary advantageous feature is the provision of an increased contact surface area between the former and a potting medium filling the space between the former and the case. The former includes keying slots on at least one of its sides facing towards the respective closed side of the metal case wherein the potting medium resides. For example the keying slots are arranged on two sides of the former or alternatively on all four sides of the former facing the respective closed sides of the case. The potting medium is filled into the keying slots of the former ensuring higher stability in the metal detector.

The former can be made from a single piece or be constructed using several parts and assembled before inserting it into the case. The former constructed in the present disclosure has a width equal to the inner width of the case which rules out having to fill the space with potting medium width-wise and adds to the stability of the system.

In the context of the present disclosure the term inner width of the case and width of the former are defined to extend in a direction along the pass-through aperture through which products to be inspected are transported.

An exemplary advantageous feature of exemplary embodiments is that the former is inserted into the case from the aperture side. It is known that the former was either inserted inside the case from the side perpendicular to the aperture or the case was constructed around the former using methods like metallic painting, arcspraying, plating and the like as mentioned in GB 2267351 A. The former used in exemplary embodiments has a width equal to the inner width of the case and therefore, cannot be inserted from the side perpendicular to the aperture.

An exemplary method of assembling a metal detector according to the present disclosure makes it cost and labour effective as using methods like metallic painting, arcspraying, plating, etc. on a former covered with potting plastic can be an expensive affair due to usage of additional resources like machinery required to carry out the painting, spraying, etc. The present method can avoid the usage of expensive machinery to construct the case. The case and former can be constructed separately and then put together instead of constructing the case around the former. An exemplary method is disclosed of inserting a former into a case from the aperture side. If the case-former assembly is viewed in a way that the viewers eye can look through the aperture of the assembly, the case has two openings wherein the opening on its rear side (back side of the aperture) is slightly smaller than the opening on its front side (front side of the aperture). This provision makes it possible to slide the former from the front opening of the case. The sliding former is stopped by the opening on the rear side of the case due to it being smaller than the front opening of the case as discussed above, and thus the former is held on the rear side of the case. The former can include recessing means which receive protruding means present on the rear side of the case for a stable fit.

A further developed embodiment includes a retainer which holds the case and former stable once the former is inserted into the case. The retainer can include protruding means which are inserted into the recessing means of the former and held together with the use of an adhesive.

A further exemplary embodiment includes an electrostatic screen which is basically a conductive material which lines the pass-through aperture to protect the coils from the so-called bulk effect phenomenon. The proposed method discusses fitting the screen across the former in such a way that the screen considerably overlaps across the protruding means of the case rather than making a direct contact with the case. The screen only contacts the case on four corners ensuring that the conductive material is still applied to the case but the lengths of contact are significantly reduced. Thus, a small gap exists between the screen and case and also the screen is earthed in at least one position.

A further exemplary embodiment includes the addition of a liner which encompasses the case and the former once the former has been inserted into the case and the retainer has been fixated on the case. The liner is used to provide environmental protection like protection against humidity, temperature, ingress or impacts to the coil system.

A known metal detection system 10 is shown in FIG. 1 of the drawings which includes a metal detector 12 having electromagnetic coils arranged on a former (not shown in the figure) enclosed by a case 16. The metal detector has an aperture 13 through which packaged products may pass for inspection purpose using the transport equipment 18 which can be a conveyor. An electronic module 20 is included for two-way communication with the user.

Figure 2:
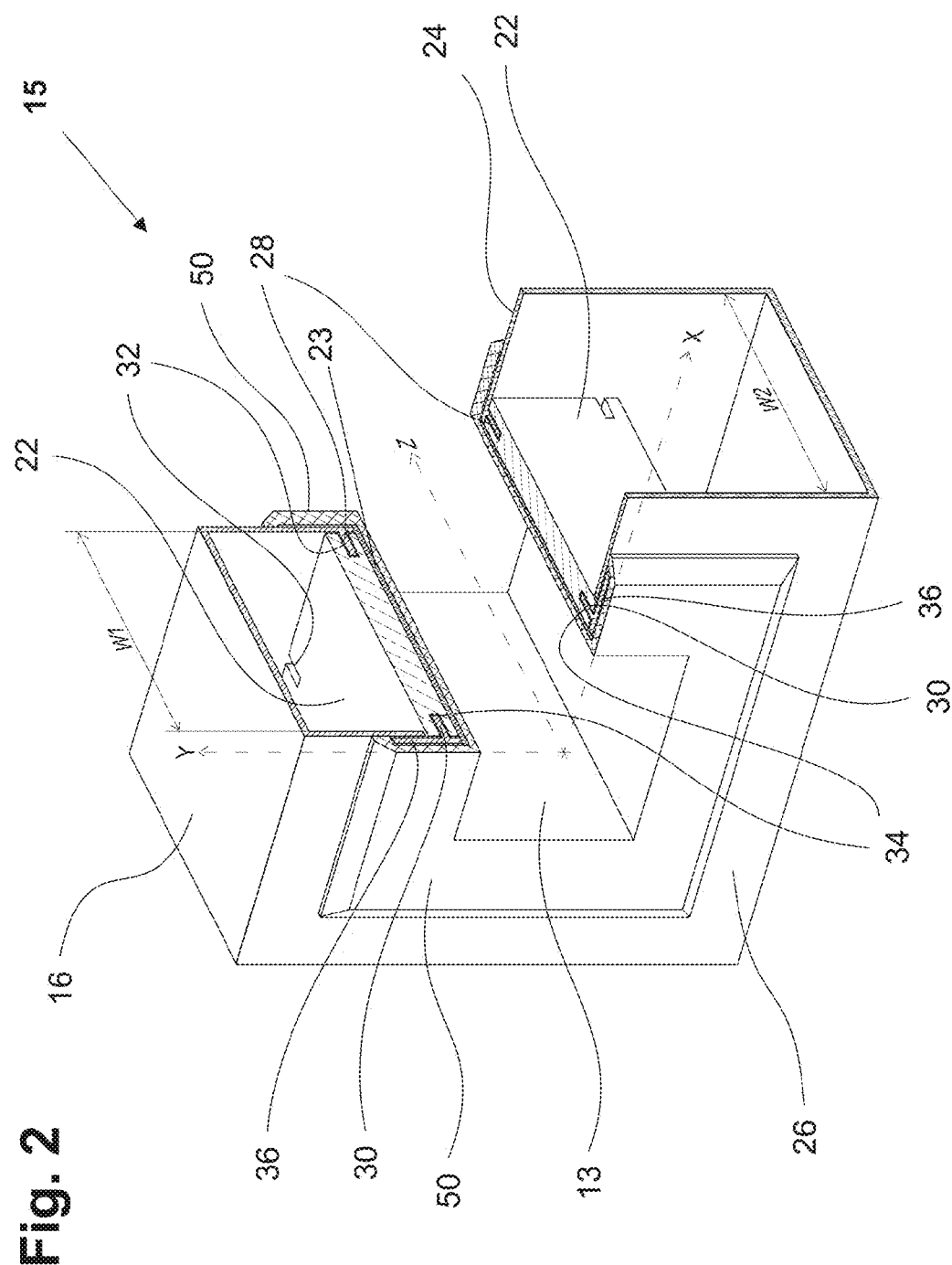
FIG. 2 is a 3-D perspective of an exemplary case-former assembly according to the present disclosure in which a corner is cut out.

An exemplary case-former assembly 15 according to the present disclosure is shown from FIG. 2, wherein a 3-D perspective of the physical connection between the case 16 and former 22 is seen in the cut-out corner as well as one side of the case which can carry the electronic module (see FIG. 1). The former 22 is inserted in the case 16. The case 16 has four closed sides 17 and two openings (as seen in FIG. 1). The width W1 of the former 22 is equal to the inner width W2 of the case 16. The case 16 has first protruding means (e.g., protrusion as shown) 28 on its rear side 24 that fits into first recessing means (e.g., recess as shown) 32 of the former 22. A retainer 36 is fixated on the case 16 after the former 22 has been inserted. The retainer 36 has second protruding means (e.g., protrusion) 30 as seen in FIG. 2 that fit into second recessing means (e.g., recess as shown) 34 of the former 22. An electrostatic screen 23 is fitted on the former 22 and retainer 36 on the side facing the aperture 13. A liner 50 is then fixed in a way that it encompasses the case 16, the former 22, the retainer 36 and the electrostatic screen 23.

The former 22 is inserted in the case 16 as discussed above. The former 22 can be made of non-conducting material and may be constructed from a single piece or can be made of four separate side pieces and be assembled to a single-piece former before being inserted into the case 16.

FIG. 3A and FIG. 3B each show a 3-D perspective of a former 22 with first recessing means 32 and second recessing means 34. The former 22 having a pass-through aperture 14, has recessing means (e.g., recesses as shown) 32, 34 on either sides of its open ends. An exemplary form of the recessing means 32, 34 can clearly be seen on the front side in FIGS. 3A and 3B. The electromagnetic coils (not shown in the figure) which create and detect an electromagnetic field inside the former 22 in presence of a metal, for example in a packaged product, are wound on the coil slots 46.

Keying slots 42 are seen in FIG. 3A and FIG. 3B, wherein these keying slots 42 have a trapezoidal cut into the body of the former 22.

According to FIG. 3A the keying slots 42 are running on all four sides of the former 22 facing the respective closed sides 17 of the case 16 and according to FIG. 3B, the keying slots 42 are only present on the top side and the bottom side of the former 22. According to exemplary embodiments, it is necessary that the keying slots 42 be present on at least one side of the former 22 facing the respective closed side 17 of the case 16 to increase the contact surface area between the former 22 and a potting medium 54 (potting medium shown in FIG. 5) present between the former 22 and the case 16. Alternative embodiments can be considered wherein the keying slots 42 can be shaped circular, rectangular, conical, or polygonal.

FIG. 4 and FIG. 5 are sections of the case-former assembly 15 cut along the Y-Z plane of FIG. 2. Referring FIG. 2 and FIG. 4, it can be seen that the case 16 has a front side 26 and a rear side 24. Further in FIG. 4, the case 16 has two openings, namely first opening 38 of length d1 on the rear side 24 of the case and a second opening 40 of length d2 on the front side 26 of the case, wherein the length d2 of second opening 40 is slightly greater than the length d1 of first opening 38, so that the former 22 can pass through the second opening 40 of the case 16, but be retained on the rear side 24 of the case 16. The former 22 is inserted from the front side 26 of the case 16 through the second opening 40 of the case 16. The physical connection between the case 16 and the former 22 is facilitated using protruding and recessing means as explained further. The case 16 has a set of first protruding means 28 on its rear side 24 which fits into the corresponding first recessing means 32 of the former 22. The former 22 has a second recessing means 34 upon which is fitted a retainer 36 having a set of corresponding second protruding means 30.

FIG. 4 shows the method of inserting the former 22 inside the case 16 from the front side 26 of the case 16. Adhesive means 62 are applied on the first recessing means 32 of the former 22 before inserting the former 22 inside the case 16. As a result, the rear side 24 of the case comprising of the set of first protruding means (e.g., protrusion) 28 receive the first recessing means (e.g., recess) 32 of the former 22. The adhesive means (e.g., adhesive) 62 holds the bond of the former 22 and case 16 together on the rear side 24 of the case 16. Adhesive means 62 are then applied on the second recessing means 32 of the former 22 after inserting the former 22 inside the case 16. After applying adhesive means 62, a retainer 36 is fixated on the case 16 on the front side 26 of the case 16. The second recessing means (e.g., recess) 34 of the former 22 receive the second protruding means (e.g., protrusion) 30 present on the retainer 36. These second protruding means 30 are inserted into the second recessing means 34 and the bond is strengthened by adhesive means 62 as mentioned above. Upon the insertion of the second protruding means 30, the retainer 36 is held together with respect to the case 16 using inserts 43 (for example Rivnut® fasteners). The retainer 36 is then welded onto the case 16 using a weld fillet 35 (as shown in FIG. 8).

FIG. 5 shows the side view of the case-former assembly 15 cut along in the Y-Z plane of FIG. 2. After the former 22 has been inserted into the case 16 and the retainer 36 is fixed onto the assembly, a potting medium 54 is then filled in the space between the case 16 and the former 22 from the opening meant for the electronic module 20 as seen in FIG. 1. After filling the case 16 with the potting medium 54, the opening is closed with the electronic module 20 (as seen in FIG. 1). The keying slots 42 on the former 22 (seen in FIG. 4 and FIG. 5) help in increasing the contact surface area between the former 22 and the potting medium 54, thus ensuring the stability of the case-former assembly 15 in case of mechanical vibrations or shocks. The potting medium 54 can be a resin filler with a composition of 80% filler material (for eg. Chalk, quartz, polymer, etc.) and 20% resin or foam or any other similar material.

Figure 6:
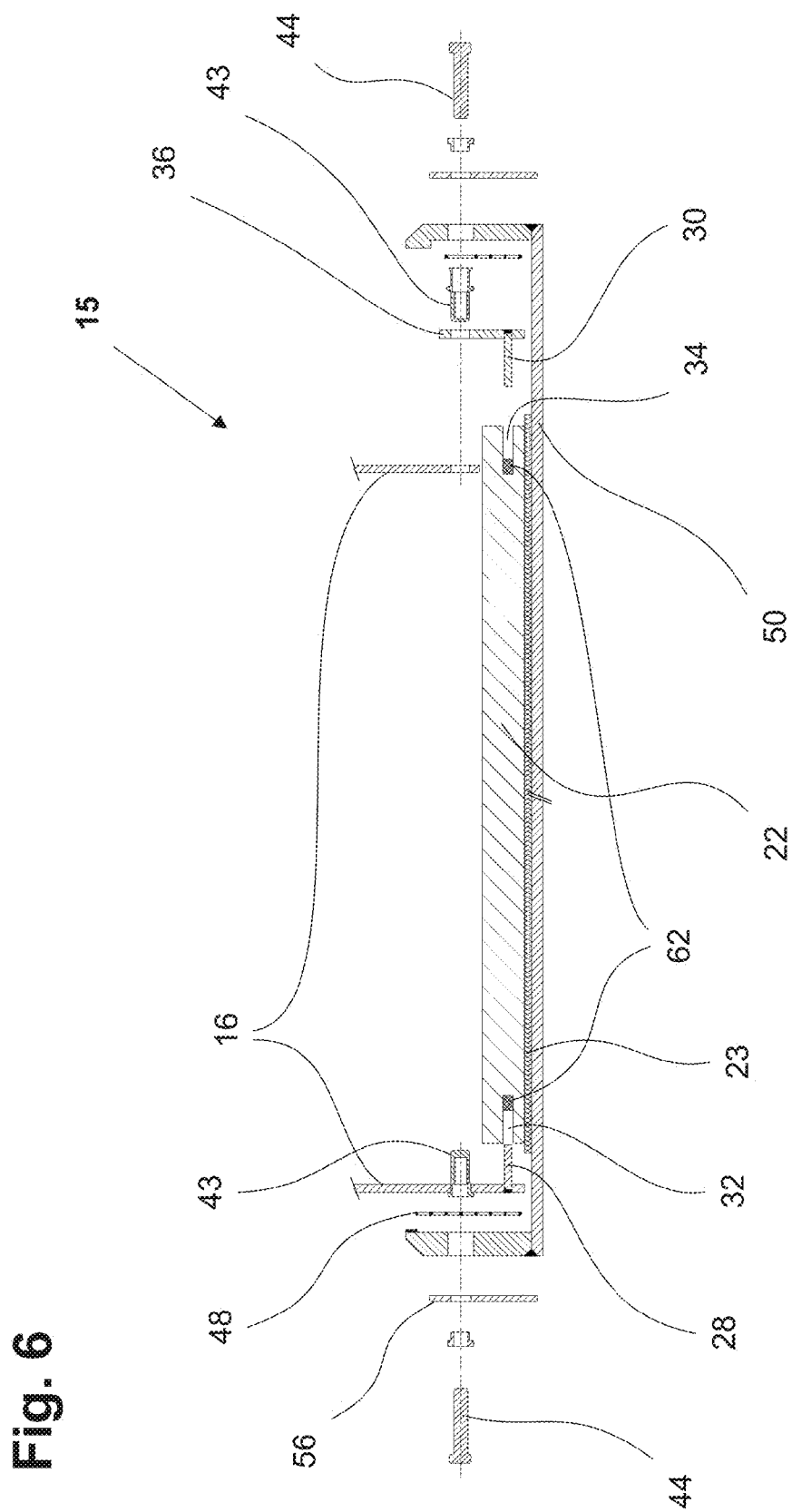
FIG. 6 is the top part of the side view of an exploded view of the case-former assembly cut along the Y-Z plane as shown in FIG. 2.

FIG. 6 is the top part of the side view of an exploded view of the case-former assembly 15 which is cut along the X-Z plane of FIG. 2. The electrostatic screen 23 is fitted onto the former 22 in such a way that it covers some part of the case 16 and the retainer 36 as seen in FIG. 6. The case-former assembly 15 is then encompassed by a liner 50 whose functionality is to provide environmental protection to the electromagnetic coils (not shown in figure). The liner 50 can be made up of thermoplastic material like polypropylene, ABS (Acrylonitrile Butadiene Styrene) to name a few. A combed multi-seal 48 is a layer of silicon having a comb structure which is used to tighten the space between the liner 50 and the case 16 to prevent water or any other external material entering the liner 50. Fastening means (e.g., fastener as shown) 44 are used to fix the liner 50 to the case 16 outside of the area where the former 22 is present within the case 16 in a way that it does not touch the former 22. The former 22 is thus not under any mechanical tension which makes the metal detector tension-free. The clamping bezel 56 is used to hold the liner 50 in place with respect to the case-former assembly 15.

Figure 7:
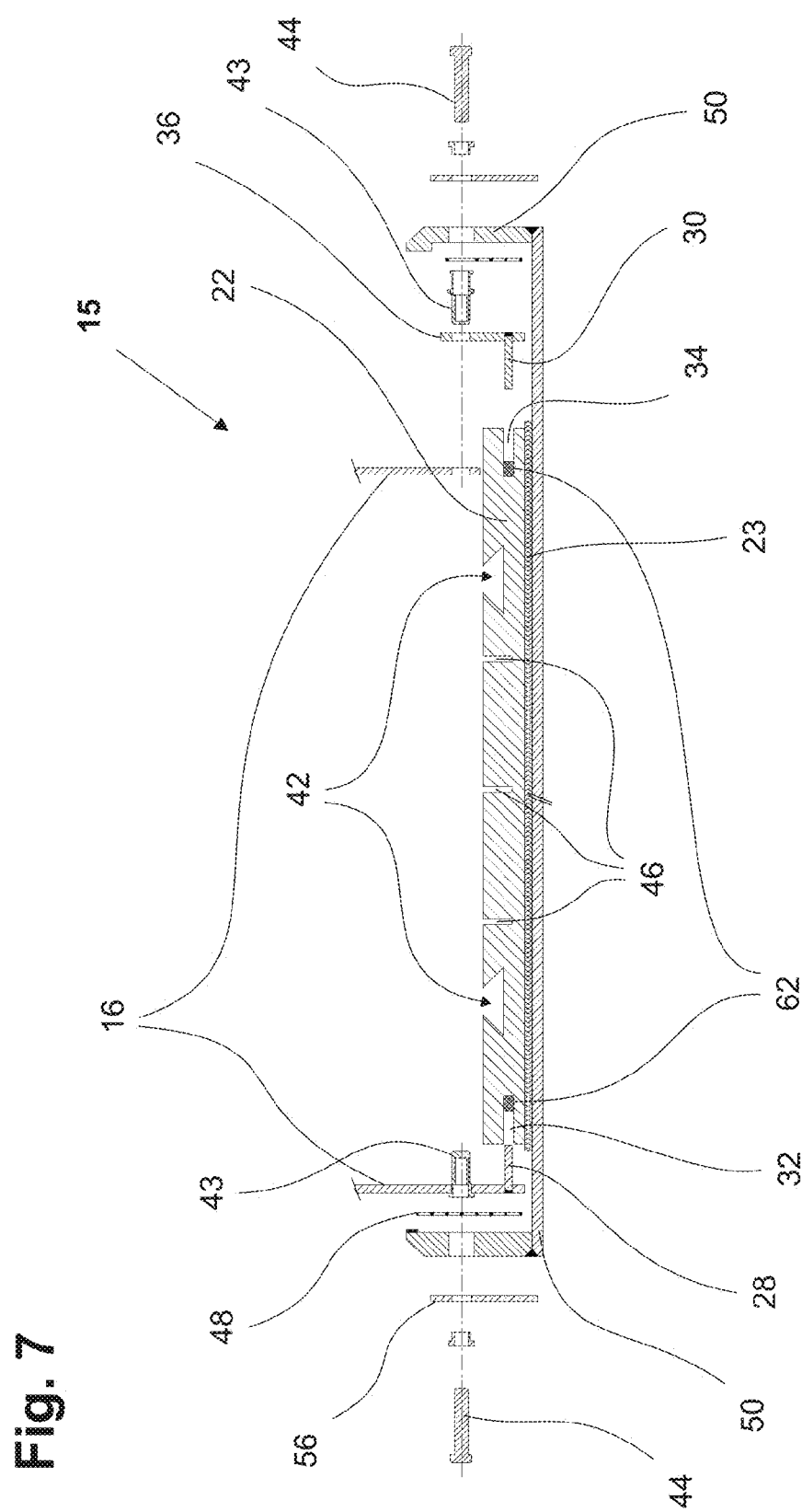
FIG. 7 is a top part of the side view of an exploded view of the case-former assembly cut along the Y-Z plane as shown in FIG. 2, which is basically shown in FIG. 6 including exemplary details like the keying slots and coil slots on the former.
Figure 8:
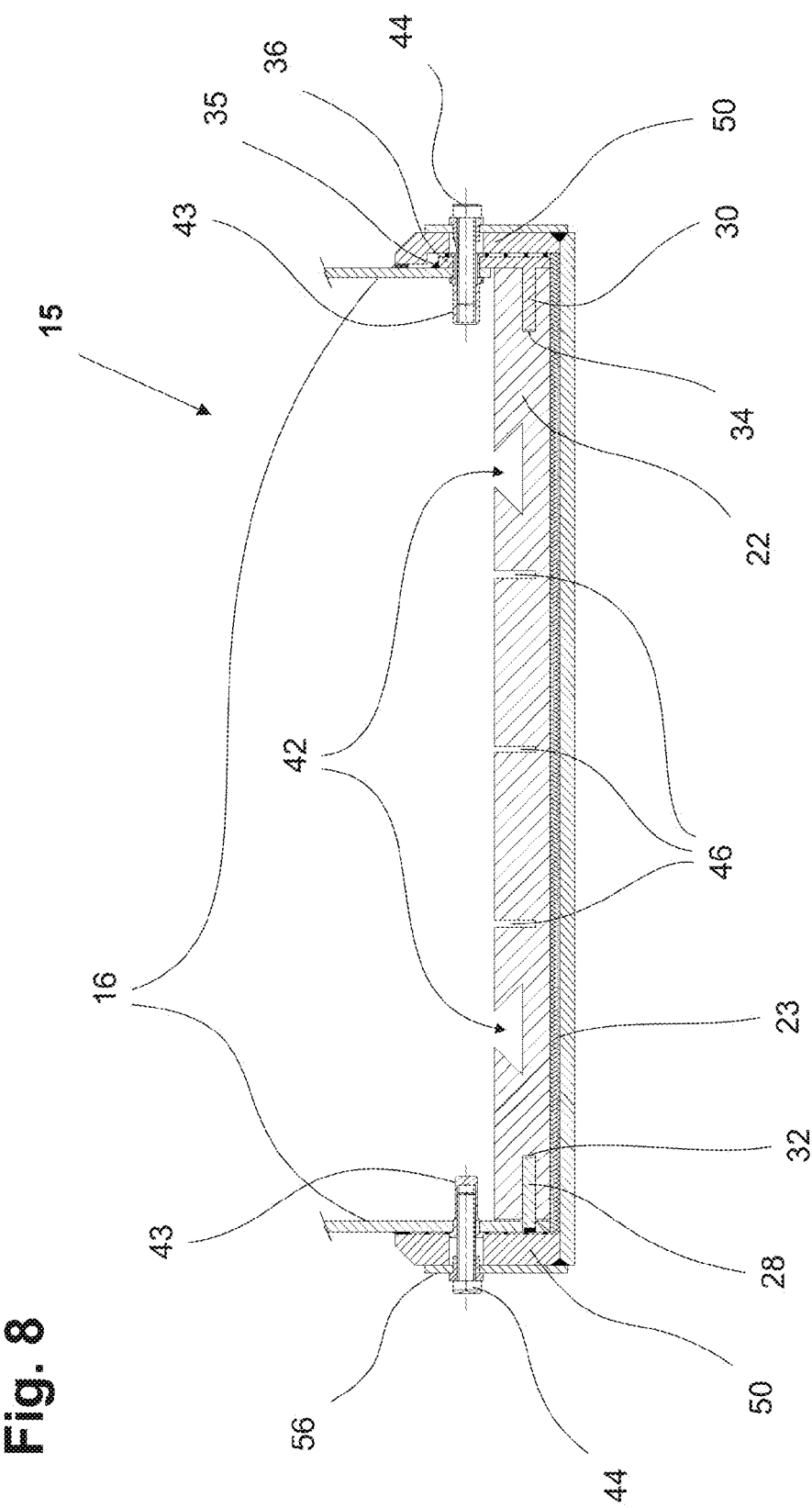
FIG. 8 is a top part of the side view of a mounted view of the case-former assembly cut along the Y-Z plane as shown in FIG. 2, with additional exemplary details like the keying slots and coil slots on the former.

FIG. 7 and FIG. 8 show the top part of the side view of an exploded and mounted view of the case-former assembly 15 respectively cut along the X-Z plane of FIG. 2. FIG. 7 and FIG. 8 is a detailed figure compared to FIG. 6. The added details include coil slots 46 and keying slots 42. The electromagnetic coils (not shown in figure) are wound on these coil slots 46 shown in FIG. 7 and FIG. 8. The keying slots 42 are present to increase the contact surface area between the potting medium 54 (not seen in FIGS. 7 and 8) and the former 22.

Figure 9:
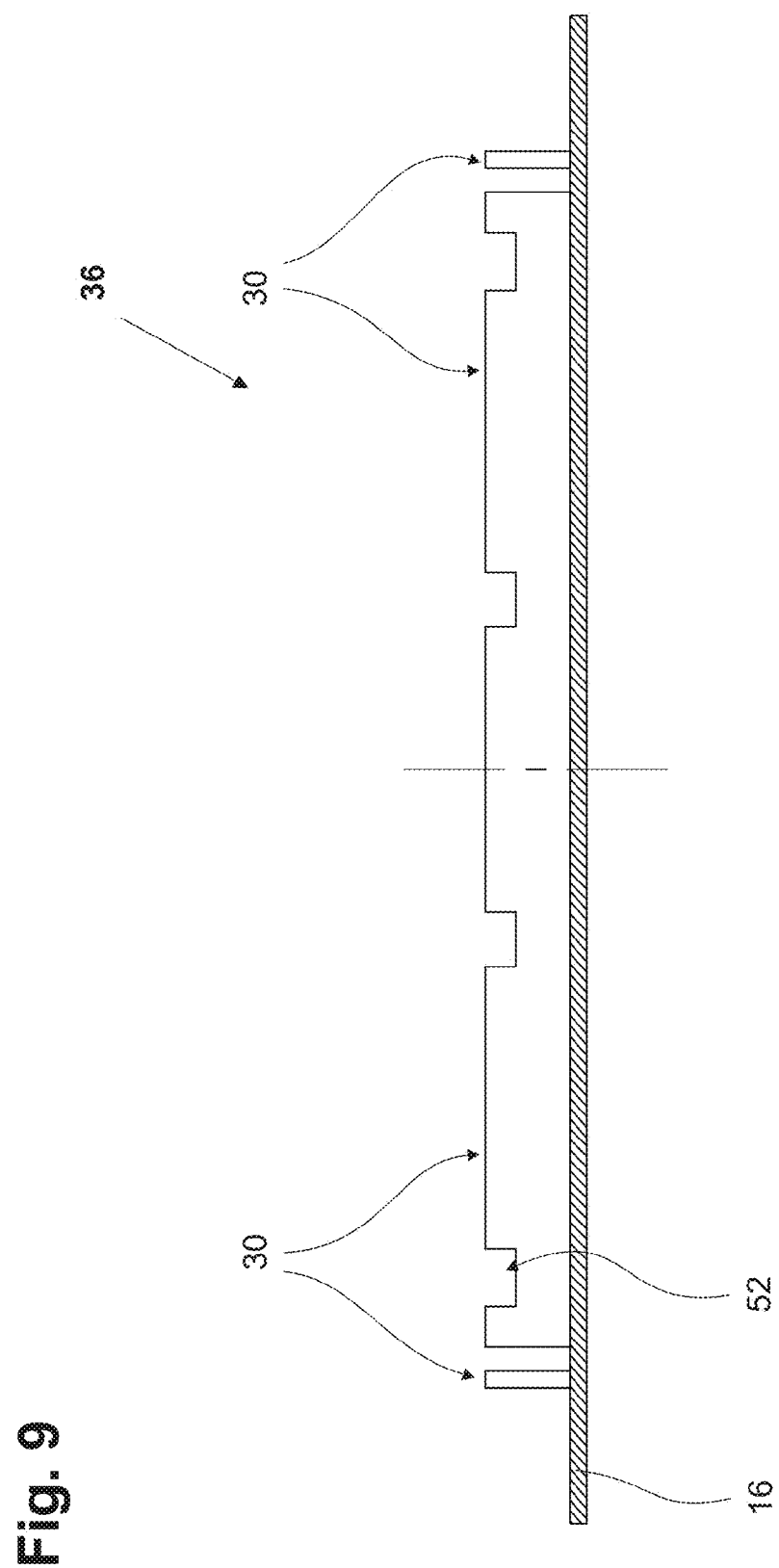
FIG. 9 is a side view of retainer having second protruding means running along its perimeter.

As mentioned earlier, once the former 22 has been inserted into the case 16, the retainer 36 is fixated onto the case 16. The retainer 36 retains the entire assembly and closes it from the front side 26 of the case 16. FIG. 9 shows the top view of the retainer 36 that includes the second protruding means 30. These second protruding means 30 include flanges as protruding means running along the perimeter of the retainer 36 except at the corners as seen in FIG. 9. The flanges can be with or without indentations 52.

Figure 10:
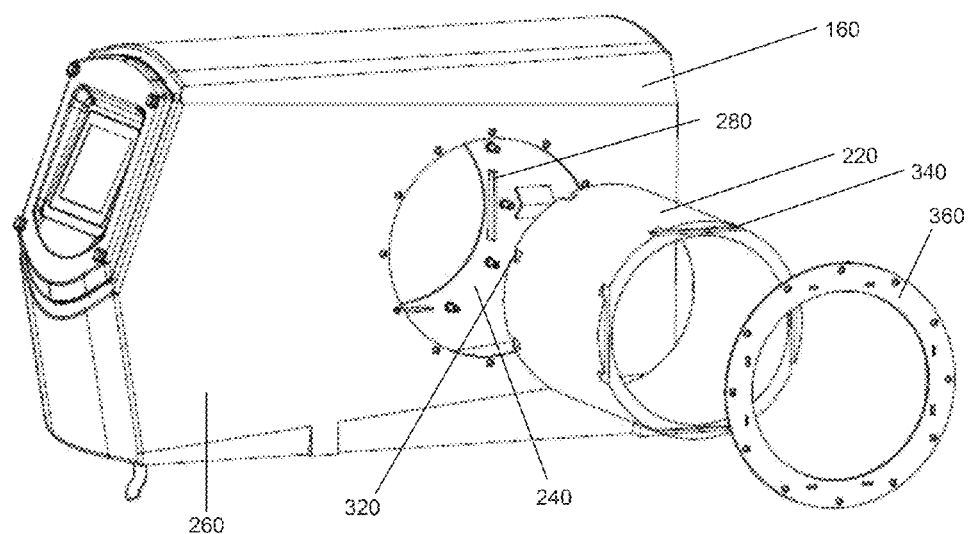
FIG. 10 is a 3-D perspective of the case-former assembly seen from the front side of the case according to an alternative exemplary embodiment disclosed herein.
Figure 11:
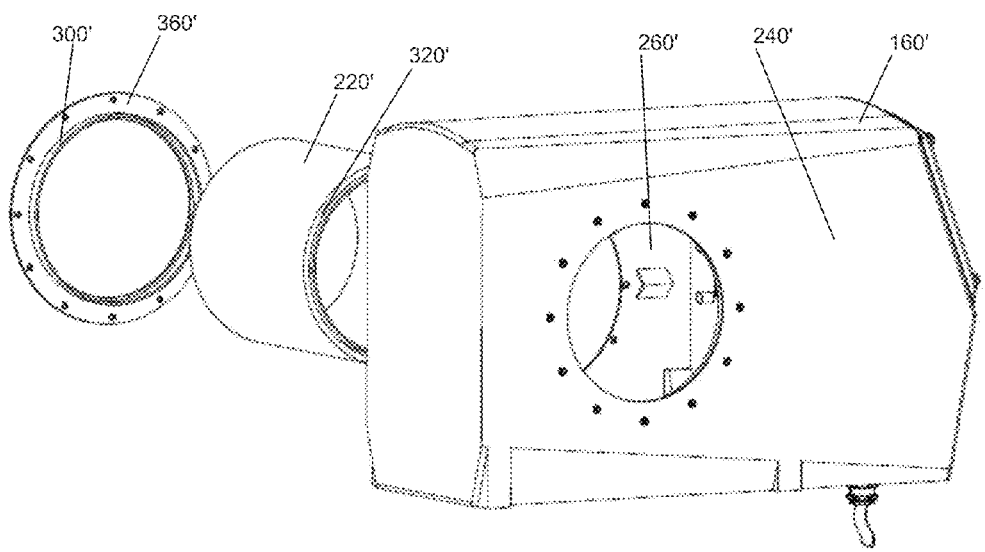
FIG. 11 is a 3-D perspective of the case-former assembly seen from the rear side of the case according to another alternative exemplary embodiment disclosed herein.

FIG. 10 and FIG. 11 show two exemplary alternative embodiments wherein the former 220, 220' has a circular cross-section creating therein a circular pass-through aperture. Both these embodiments also have a retainer 360, 360' having a circular cross-section and fitting onto the former 220, 220' from the front side 260 of the case 160. The first and second opening of the case 160, 160' also have a corresponding circular cross-section as seen in the FIGS. 10 and 11.

As seen in FIG. 10, the case 160 has first protruding means (e.g., protrusion as shown) 280 on its rear side 240 that fits into first recessing means (e.g., recess) 320 of the former 220 when the former 220 is slid inside the case 160 from the front side 260 of the case 160. A circular cross-sectional retainer 360 corresponding to the circular cross-sectional former 220 is fixated on the case 160 after the former 220 has been inserted into the case 160. The retainer 360 has second protruding means that fit into second recessing means 340 of the former 220. As seen in FIG. 10, the first protruding means 280 run non-continuously in parallel around the first opening on the rear side 240 of the case 160. The second protruding means also run non-continuously along the perimeter of the retainer 360 facing towards the front side 260 of the case 160.

The metal detector as shown in FIG. 11, has first protruding means (not shown in the Figure) on its rear side 240' of the case 160' that fits into first recessing means 320' of the former 220' when the former 220' is slid inside the case 160' from the front side 260' of the case 160'. A circular cross-sectional retainer 360' corresponding to the circular cross-sectional former 220' is fixated on the case 160' after the former 220' has been inserted into the case 160'. The retainer 360' has second protruding means 300' that fit into second recessing means 340' of the former 220'. As seen in the FIG. 11, the first protruding means run continuously in parallel around the first opening on the rear side 240' of the case 160' and the second protruding means 300' run continuously along the perimeter of the retainer 360' facing towards the front side 260' of the case 160'.

It will be appreciated by those skilled in the art that the present invention can be embodied in other specific forms without departing from the spirit or essential characteristics thereof. For example, the cross-section of the former, the pass-through aperture, the first opening and the second opening of the case 16, 160, 160' and the retainer can for example, be of rectangular, quadratic, circular, or elliptical shape, but can also have any other shape that may be required in a practical application. In addition, "front side" and "rear side" are relative terms and are not necessarily related to the direction of movement of a conveyor. The terms front side and rear side, for example, can be exchanged without changing the scope of the invention.

The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A metal detector comprising:
   a case having at least four closed sides, a front side and a rear side;
   a first opening on the said rear side of said case and a second opening on the front side of said case;
   a former having a pass-through aperture, coaxial with said first and said second openings of said case, said case having an inner width (W2) in a direction along the pass-through aperture, said former having a width (W1) in a direction along the pass-through aperture, wherein said width (W1) of said former is equal to said inner width (W2) of said case;
   an arrangement of electromagnetic coils for generating and receiving an electromagnetic field inside of said pass-through aperture, wherein said coils are arranged on said former;
   said case surrounding said former;
   first protruding means attached to said case adjacent to said first opening of said case, first and second recessing means formed in said former, adhesive means which bonds said first protruding means to said first recessing means;
   a potting medium filling a space between said former and said case; and
   keying slots on at least one surface directed towards any said closed side of said case; wherein said keying slots are filled with the potting medium and increase a contact area between said former and said potting medium.

2. The metal detector according to claim 1, wherein said first opening on said rear side of said case is smaller than said second opening on said front side of said case.

3. The metal detector according to claim 1, wherein cross-sections of said first and second openings are at least one of rectangular, quadratic, circular, or elliptical shape.

4. The metal detector according to claim 1, wherein said former is formed to be inserted into said case as a single piece.

5. The metal detector according to claim 1, wherein said former is constructed from a single piece.

6. The metal detector according to claim 1, wherein the cross-section of said former is one of rectangular, quadratic, circular, or elliptical shape.

7. The metal detector according to claim 1, wherein said coils are wound around said former along its perimeter.

8. The metal detector according to claim 1, wherein the case comprises:
   a retainer, wherein said retainer includes a second protruding means, said retainer being attached to said second recessing means of said former by adhesive means which bonds said second protruding means to said second recessing means.

9. The metal detector according to claim 8, wherein said retainer is attached to said front side of the said case, and wherein said retainer is fixed to said case for retaining the former within the case.

10. The metal detector according to claim 9, wherein the cross-section of said retainer is one of rectangular, quadratic, circular, elliptical shape.

11. The metal detector according to claim 10, wherein said first protruding means comprise:
    flanges running around the first opening of the case on an inside of said rear side of said case and said second protruding means comprise:
    flanges running along the perimeter of the retainer, and wherein said first and second recessing means are formed by openings in said former running along each side of the two ends of said former facing the front side and rear side of the case.

12. The metal detector according to claim 8, wherein said first protruding means comprise:
    flanges running around the first opening of the case on an inside of said rear side of said case and said second protruding means comprise:
    flanges running along the perimeter of the retainer, and wherein said first and second recessing means are formed by openings in said former running along each side of the two ends of said former facing the front side and rear side of the case.

13. The metal detector according to claim 8, wherein said first and second protruding means are running continuous or non-continuous around the first opening of the case on the inside of said rear side of said case and along a perimeter of the retainer respectively.

14. The metal detector according to claim 8, wherein an electrostatic screen is fixed on said former on the side facing said pass-through aperture of said former, said electrostatic screen thereby overlapping said first and second protruding means of said case without direct contact with said first and said second protruding means.

15. The metal detector according to claim 8, wherein a liner encompasses said case, said former, said retainer and said electrostatic screen, wherein fastening means are used to fix the liner to the case outside of the area where the former is present within the case in a way that it does not touch the former.

16. The metal detector according to claim 1, wherein said keying slots are shaped to be at least one of trapezoidal, circular, rectangular or conical.

17. A method for assembling a metal detector having a case with front and rear sides;
- a first opening on the said rear side of said case and a second opening on the front side of said case;
- a former having a pass-through aperture, coaxial with said first and said second opening of said case, said case having an inner width (W2) in a direction along the pass-through aperture;
- said former further having a width (W1) in a direction along the pass-through aperture, and wherein the width (W1) of said former is equal to the inner width (W2) of said case;
- first protruding means arranged on the inside of said case adjacent to said first opening of said case;
- first and second recessing means formed in said former; and
- keying slots in said former on at least one surface directed towards said case; the method comprising:
- providing an arrangement of electromagnetic coils for generating and receiving an electromagnetic field inside of said pass-through aperture and arranging said electromagnetic coils on said former;
- providing adhesive means to bond said first protruding means to said first recessing means and applying said adhesive means to said first recessing means of the said former;
- inserting said former into said case by sliding said first recessing means of said former towards said first protruding means in said rear side of said case;
- providing a retainer including second protruding means;
- applying adhesive means to said second recessing means of the said former;
- inserting said second protruding means of said retainer into said second recessing means of said former;
- fixating said retainer on said case from the front side of said case; and
- filling a potting medium in the space between said former and said case.

18. The method for assembling the metal detector according to claim 17, comprising:
filling said keying slots with the potting medium and thereby increasing a contact area between said former and said potting medium.

19. The method for assembling a metal detector according to claim 17, comprising:
providing an electrostatic screen, and fixing said electrostatic screen on said former on the side facing said pass-through aperture.

20. The method for assembling a metal detector according to claim 17, comprising:
providing a liner, and fixing said liner enclosing said case using mechanical fixing means.

* * * * *